United States Patent
Tong et al.

(10) Patent No.: US 9,824,851 B2
(45) Date of Patent: Nov. 21, 2017

(54) CHARGE DRAIN COATING FOR ELECTRON-OPTICAL MEMS

(71) Applicants: William M. Tong, San Francisco, CA (US); Alan D. Brodie, Palo Alto, CA (US); Jeffrey Elam, Elmhurst, IL (US); Anil Mane, Naperville, IL (US)

(72) Inventors: William M. Tong, San Francisco, CA (US); Alan D. Brodie, Palo Alto, CA (US); Jeffrey Elam, Elmhurst, IL (US); Anil Mane, Naperville, IL (US)

( * ) Notice: Subject to any disclaimer, the term of this patent is extended or adjusted under 35 U.S.C. 154(b) by 1043 days.

(21) Appl. No.: 14/052,610

(22) Filed: Oct. 11, 2013

(65) Prior Publication Data

US 2016/0358742 A1 Dec. 8, 2016

Related U.S. Application Data

(60) Provisional application No. 61/754,577, filed on Jan. 20, 2013.

(51) Int. Cl.
*H01J 37/02* (2006.01)
*H01J 37/06* (2006.01)
*B81B 3/00* (2006.01)
*H01J 37/317* (2006.01)
*C23C 16/32* (2006.01)
(Continued)

(52) U.S. Cl.
CPC ............ *H01J 37/06* (2013.01); *B81B 3/0008* (2013.01); *C23C 16/32* (2013.01); *C23C 16/34* (2013.01); *C23C 16/40* (2013.01); *C23C 16/402* (2013.01); *C23C 16/403* (2013.01); *C23C 16/405* (2013.01); *C23C 16/45529* (2013.01); *H01J 37/026* (2013.01); *H01J 37/12* (2013.01); *H01J 37/3174* (2013.01); *H01J 2237/1205* (2013.01); *H01J 2237/31794* (2013.01)

(58) Field of Classification Search
CPC ......... H01J 2237/31789; H01J 37/3175; H01J 2237/31793; H01J 2237/31794; H01J 37/026
See application file for complete search history.

(56) References Cited

U.S. PATENT DOCUMENTS 5,054,046 A * 10/1991 Shoulders ................. H01J 3/00
313/131 A
5,148,461 A * 9/1992 Shoulders ................. H01J 1/30
378/119
(Continued)

OTHER PUBLICATIONS

Written Opinion of the International Searching Authority dated May 7, 2014 related to PCT/US2014/012127 filed Jan. 17, 2014.
(Continued)

*Primary Examiner* — Wyatt Stoffa
(74) *Attorney, Agent, or Firm* — Dergosits & Noah LLP

(57) ABSTRACT

A system and method associated with a charge drain coating are disclosed. The charge drain coating may be applied to surfaces of an electron-optical device to drain electrons that come into contact with the charge drain coating so that the performance of the electron-optical device will not be hindered by electron charge build-up. The charge drain coating may include a doping material that coalesces into clusters that are embedded within a high dielectric insulating material. The charge drain coating may be deposited onto the inner surfaces of lenslets of the electron-optical device.

14 Claims, 15 Drawing Sheets

(51) Int. Cl.
*C23C 16/34* (2006.01)
*C23C 16/40* (2006.01)
*C23C 16/455* (2006.01)
*H01J 37/12* (2006.01)

(56) References Cited

U.S. PATENT DOCUMENTS

| | | | | |
|---|---|---|---|---|
| 8,089,051 B2* | 1/2012 | Grella | ................... | B82Y 10/00 |
| | | | | 250/396 ML |
| 8,253,119 B1* | 8/2012 | Brodie | ................ | H01J 37/3175 |
| | | | | 250/306 |
| 9,214,344 B1* | 12/2015 | Brodie | ................... | H01L 21/20 |
| 2002/0115309 A1* | 8/2002 | Nakasuji | ................ | B82Y 10/00 |
| | | | | 438/800 |
| 2003/0183781 A1* | 10/2003 | Tromp | ................... | B82Y 10/00 |
| | | | | 250/492.22 |
| 2005/0179107 A1 | 8/2005 | Pophristic et al. | | |
| 2007/0202645 A1 | 8/2007 | Luo et al. | | |
| 2009/0114837 A1* | 5/2009 | Grella | ................... | B82Y 10/00 |
| | | | | 250/396 R |
| 2010/0187433 A1* | 7/2010 | Eastham | ................ | B82Y 15/00 |
| | | | | 250/396 R |
| 2011/0204251 A1 | 8/2011 | Grella et al. | | |
| 2012/0037813 A1* | 2/2012 | Lanio | ................... | H01J 37/141 |
| | | | | 250/396 ML |
| 2012/0085919 A1 | 4/2012 | Kojima et al. | | |
| 2012/0187305 A1* | 7/2012 | Elam | ................... | H01J 43/246 |
| | | | | 250/390.01 |
| 2012/0305798 A1 | 12/2012 | Zonnevylle et al. | | |
| 2013/0134324 A1* | 5/2013 | Brodie | ................... | H01J 23/06 |
| | | | | 250/398 |
| 2015/0340195 A1* | 11/2015 | Brodie | ................. | H01J 37/045 |
| | | | | 250/396 R |

OTHER PUBLICATIONS

International Application No. PCT/US2014/012127, International Filing Date, Jan. 17, 2014, PCT Notification of Transmittal of the International Search Report and The Written Opinion of the International Searching Authority, or the Declaration, dated May 7, 2014.

English Translation of Office Action dated May 18, 2017 re Taiwan Patent App. No. 103102011.

Office Action dated May 18, 2017 re Taiwan Patent App. No. 103102011.

English Translation of Search Report dated Apr. 15, 2017 re Taiwan Patent App. No. 103102011.

\* cited by examiner

CHARGE DRAIN COATING FOR ELECTRON-OPTICAL MEMS

CROSS REFERENCE TO RELATED APPLICATION

The present application claims priority under 35 U.S.C §119 (e)(1) to U.S. Provisional Patent Application No. 61/754,577 filed on Jan. 20, 2013 and entitled "Nanoengineered charge drain coating for electron-optical MEMS," which is hereby incorporated by reference.

GOVERNMENT LICENSE RIGHTS

This invention was made with government support under contract number HR0011-07-9-0007 awarded by the Defense Advanced Research Projects Agency. The government has certain rights in the invention.

FIELD

The present disclosure relates to charge draining. In some embodiments, the disclosure relates to a charge drain coating for electron-optical micro-electro-mechanical systems (MEMS).

BACKGROUND

Conventional electron-beam (e-beam) lithography systems and methods are typically associated with low throughput, thereby limiting conventional e-beam lithography systems and methods to low volume production environments or applications. However, new e-beam lithography systems and methods have been designed to increase the throughput of e-beam lithography. For example, advances in MEMS technology have enabled the use of electron-optical MEMS devices within an e-beam lithography system to allow for parallel e-beam lithography. Thus, the use of the electron-optical MEMS devices is increasing the throughput of e-beam lithography so that such technology may be used in higher volume production environments or applications.

The electron-optical MEMS component may be subject to electrostatic charging. For example, electrons may become embedded into portions of the electron-optical MEMS component and an electron charge may build up on the electron-optical MEMS component. Such a charge build up may interfere with the operation of the electron-optical MEMS component.

As such, what is needed are systems and methods to discharge electrons from electron-optical MEMS components used in e-beam lithography. For example, a charge drain coating may be applied to portions of the electron-optical MEMS component that are susceptible to electrostatic charging.

SUMMARY

In some embodiments, a MEMS device may receive an electron beam in an electron-beam lithography chamber. The MEMS device may include a plurality of lenslets to receive electrons from the electron beam. In some embodiments, each of the lenslets may be configured to either absorb or reflect at least some of the electrons from the electron beam. The MEMS device may further include a charge drain coating on the inner surfaces (e.g., sidewalls and/or bottom) of each of the lenslets to drain any of the electrons that have become embedded into the charge drain coating. In some embodiments, the charge drain coating includes insulating material and at least one doping material embedded within the insulating material.

In some embodiments, the doping material includes at least one nanocluster.

In some embodiments, the MEMS device may be used for reflective electron beam lithography (REBL). For example, the MEMS device may be a digital pattern generator (DPG) with an array of the lenslets. Furthermore, each of the lenslets may be holes in the substrate of the MEMS device. Each of the lenslets may be selectively configured to either absorb or reflect at least some of the electrons.

In some embodiments, the charge drain coating may include layers of the insulating material and layers of the doping material. The doping layers may include clusters of the doping material.

In some embodiments, the insulating material may have a high dielectric strength and the doping material may be a metal or an oxide, carbide, nitride, or elemental form of a metal.

DETAILED DESCRIPTION

Figure 1:
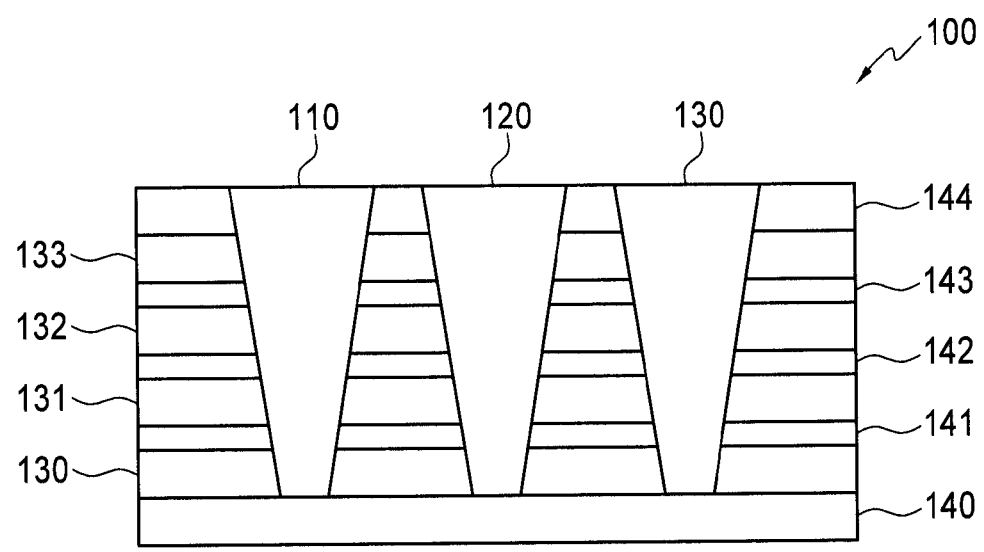
FIG. 1 illustrates a diagram of an example electron-optical MEMS environment in accordance with some embodiments.

FIG. 1 illustrates a diagram of an example electron-optical MEMS component 100. In general, the electron-optical MEMS component 100 includes various features used to operate as an array of electron mirrors. For example, the electron-optical MEMS component 100 may be part of a reflective electron beam lithography (REBL) process to be used in high production volume e-beam lithography applications. The features of the electron-optical MEMS component 100 may be used to reflect or absorb portions of the electron beam. As such, the electron-optical MEMS component 100 may be used in the transmission of electrons (e.g., electrons illuminate from the backside and come out the front side of a device).

As shown in FIG. 1, the electron-optical MEMS component 100 may be composed of multiple layers of materials. In some embodiments, the electron-optical (or electro-optical) MEMS component 100 may include doping layers and insulating layers. For example, the electron-optical MEMS component 100 may include doping layers 140, 141, 142, 143, and 144 and insulating layers 130, 131, 132, and 133. In some embodiments, the doping layers may be operated as electrodes. For example, the doping layers 140 may be considered the bottom electrode, the doping layers 141, 142, and 143 may be considered the lower electrode, middle electrode, and upper electrodes respectively, and the doping layer 144 may be considered the top electrode. In some embodiments, the doping layers may be constructed of titanium nitride (TiN). The thickness of the doping layers may vary. In some embodiments, the bottom electrode and the top electrode may be larger or thicker than the lower, middle, and upper electrodes. For example, the bottom and top electrodes may each be 300 nm thick and the lower, middle, and upper electrodes may each be 60 nm thick. The insulating layers 130, 131, 132, and 133 may be constructed of silicon oxide (e.g., $SiO_2$). As shown, an insulating layer may be between each of the electrode (or doping) layers. In some embodiments, the insulating layers are dielectric layers. In the same or alternative embodiments, the insulating layers may each be a thickness larger than any of the doping layers. For example, the insulating layers may be between 750 and 900 nm thick.

The electron-optical MEMS component 100 may include various MEMS features. For example, the electron-optical MEMS component 100 may include lenslets (i.e., holes or wells) 110, 120, and 130 that may operate as switchable or configurable electron mirrors. For example, each of the lenslets 110, 120, and 130 may be separately configured or switched to either absorb or reflect a portion of an electron beam. In some embodiments, the lenslets 110, 120, and 130 may be configured to absorb or reflect a portion of the electron beam based on the use of the electrodes (e.g., electrodes 140, 141, 142, 143, and 144). For example, each of the lenslets 110, 120, and 130 may operate as an electron mirror with two states (e.g., absorb or reflect). In some embodiments, each of the lenslets may be configured to absorb a portion of the electron beam if a positive potential is applied across the lenslet's respective electrodes (i.e., the electron mirror is turned off). Furthermore, each of the lenslets may be configured to reflect a portion of the electron beam if a negative potential is applied across the lenslet's respective electrodes (i.e., the electron mirror is turned on).

In some embodiments, the electron-optical MEMS component 100 may be a digital pattern generator (DPG) for the REBL tool as earlier described. As such, the lenslets of the DPG may be used to individually absorb or reflect electrons from the electron beam that enters the lenslet. Thus, the electron-optical MEMS component 100 may be considered a two-dimensional array of configurable electron mirrors. Although the electron-optical MEMS component 100 shows three lenslets (e.g., lenslets 110, 120, and 130), the electron-optical MEMS component 100 may include any number of lenslets or other electron-optical MEMS features. For example, the electron-optical MEMS component 100 may include a 248×4096 two dimensional array of lenslets.

As such, the electron-optical MEMS component may include a plurality of lenslets. Each lenslet may be configured or switched to either reflect electrons from the electron beam that has entered the lenslet or to absorb electrons from the electron beam that has entered the lenslet. In some embodiments, the electron-optical MEMS component may be a DPG used in a REBL process. The lenslets may be wells or holes in the electron-optical MEMS component. For example, the electron-optical MEMS component may include multiple doping and insulating layers. The lenslets may be openings in such doping and insulating layers.

Figure 2:
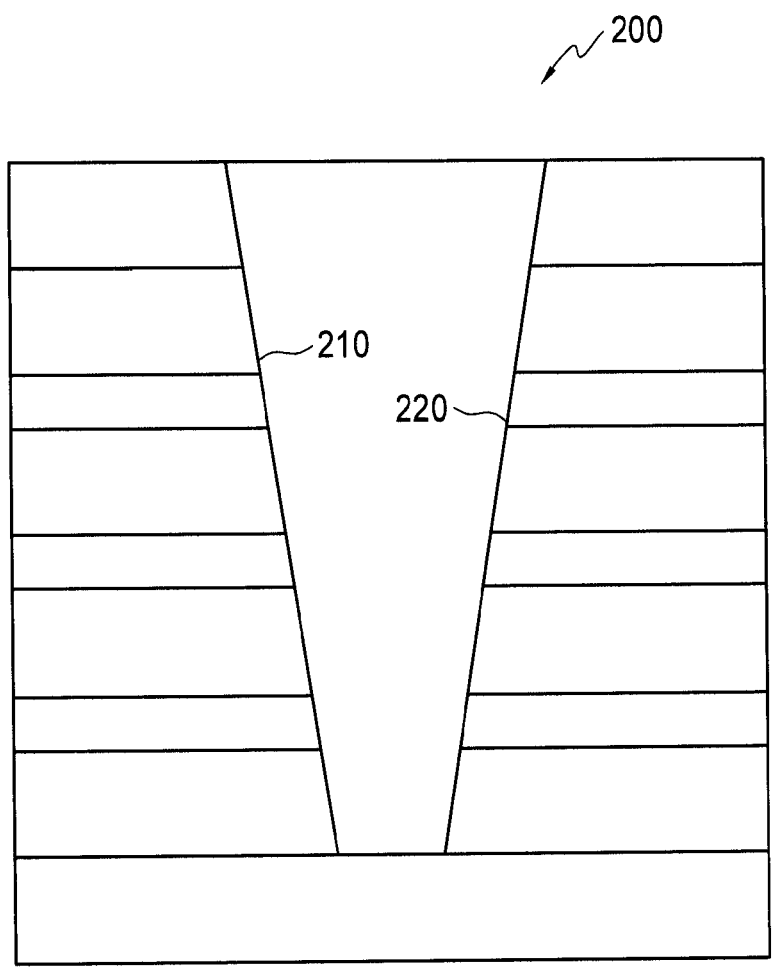
FIG. 2 illustrates a diagram of an example lenslet of an electron-optical MEMS component in accordance with some embodiments of the disclosure.

FIG. 2 illustrates a diagram of an example lenslet of an electron-optical MEMS component. In general, the lenslet (e.g., lenslet 110, 120, or 130) may be part of an electron-optical MEMS component (e.g., electron-optical MEMS component 100) such as a DPG used in the REBL process.

As shown in FIG. 2, the lenslet may be a hole or a well within the electron-optical component. As such, the lenslet may include sidewalls 210 and 220 that include the doping layers (e.g., doping layers 140, 141, 142, 143, and 144) and insulating layers (e.g., insulating layers 130, 131, 132, and 133).

Figure 3:
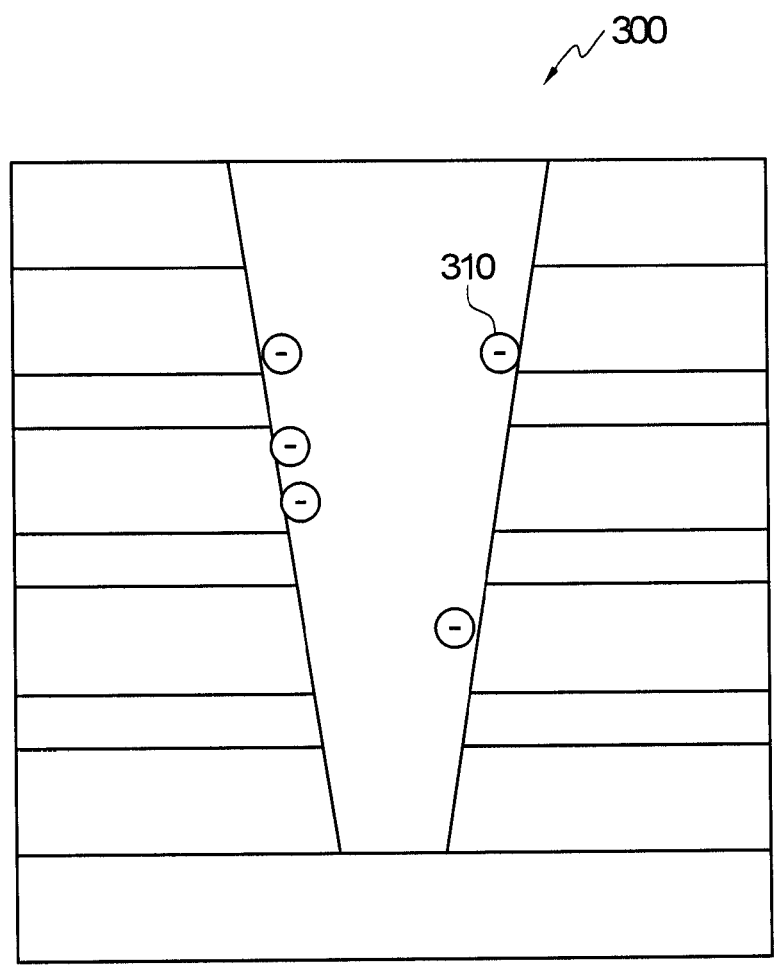
FIG. 3 illustrates an example of electron charge on a sidewall of the lenslet of the electron-optical MEMS in accordance with some embodiments.

FIG. 3 illustrates an example of electron charge on a sidewall of the lenslet of the electron-optical MEMS in accordance with some embodiments. In general, electrons from an electron beam may enter the lenslet (e.g., lenslet 110, 120, or 130) and become embedded into the sidewalls of the lenslet. The buildup of electron charge may interfere with the operation of the lenslet that is part of an electron-optical MEMS component (e.g., a DPG).

As shown in FIG. 3, electrons from an electron beam that is part of the REBL process may enter the lenslet. In some embodiments, electrons from the electron beam may become embedded into parts of the sidewall (e.g., sidewalls 210 and/or 220) of the lenslet. Such embedding of electrons may create electrostatic charging and interfere with the intended operation of the lenslet (e.g., the configuring of the lenslet to either reflect or absorb electrons). For example, electrons 310 may become embedded into the portions of the sidewall that include the insulating layers (e.g., the $SiO_2$ dielectric layers).

Figure 4:
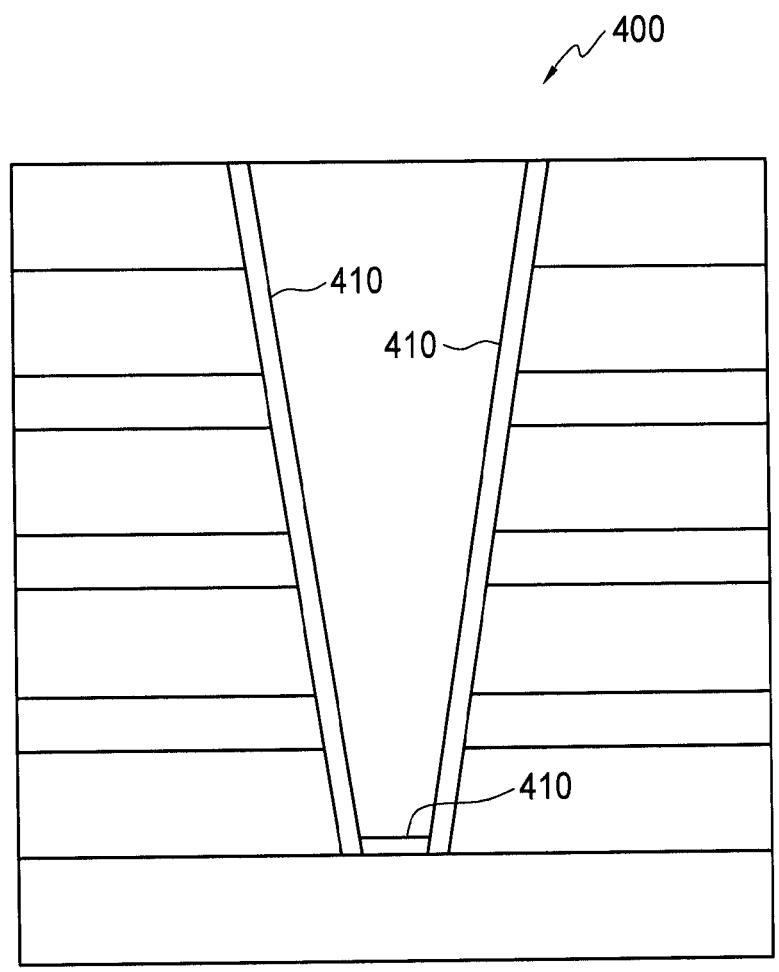
FIG. 4 illustrates an example of a lenslet with a charge drain coating applied to the sidewalls in accordance with some embodiments.

FIG. 4 illustrates an example of a lenslet with a charge drain coating applied to the sidewalls in accordance with some embodiments. In general, the charge drain coating may be used to drain or discharge the electrons (e.g., electrons 310) that have become embedded onto the sidewalls (e.g., sidewalls 210 and/or 220) of a lenslet (e.g., lenslets 110, 120, and/or 130).

As shown in FIG. 4, a charge drain coating 410 may be applied to the inner surfaces (e.g., sidewalls and bottom) of the lenslet 110. In some embodiments, the charge drain coating 410 may have a resistance that is low enough to drain the charge buildup from electrons, but the resistance of the charge drain coating 410 may not be low enough to result in a short-circuit of the electrode or doping layers of the lenslet. Moreover, the resistance of the charge drain coating 410 may not be so low as to affect or change the intended voltages applied to the various electrodes of the lenslet. Furthermore, the charge drain coating 410 may be applied uniformly to all of the surfaces or surface orientations (e.g., the sidewalls) of the lenslets in an electron-optical MEMS component. Such uniformity of the application of the charge drain coating 410 may ensure identical performance of each lenslet and may further ensure uniform electrostatic fields within each lenslet.

As such, a charge drain coating may be applied to portions of an electron-optical MEMS component. In some embodiments, the charge drain coating may be applied to features of a device that is used to manipulate portions (e.g., emitted electrons) of an electron beam. For example, the charge drain coating may be applied to the sidewalls of lenslets of a DPG. The charge drain coating may remove electrostatic charging that may interfere with the operation of the lenslet (e.g., the manipulation of the portions of the electron beam). Further details with regard to the lenslet with a charge drain coating applied to its inner surfaces are disclosed in U.S. patent application Ser. No. 12/510,049 entitled "Well-based dynamic pattern generator" filed on Jul. 27, 2009 and issued as U.S. Pat. No. 8,253,119, which is hereby incorporated by reference.

Figure 5:
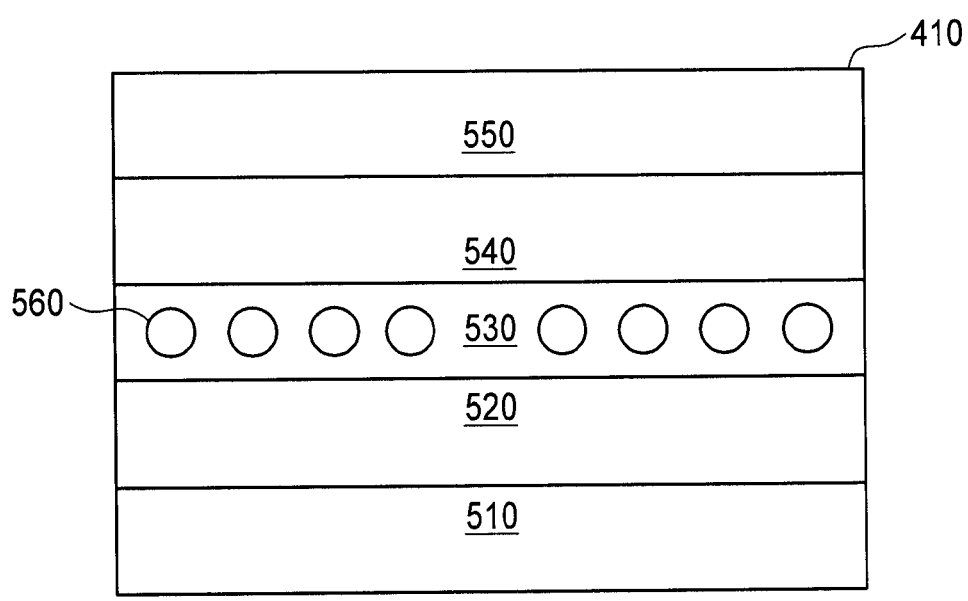
FIG. 5 illustrates a diagram of an example structure of the charge drain coating in accordance with some embodiments.

FIG. 5 illustrates a diagram of an example structure of the charge drain coating in accordance with some embodiments. In general, the charge drain coating (e.g., charge drain coating 410) may be composed of a plurality of layers of materials including a nanocluster-based doping layer and insulating layers.

As shown in FIG. 5, the charge drain coating 410 may include a plurality of layers. In some embodiments, the doping layer may include nanoclusters of a conductive material that is embedded within insulating material. For example, the conductive material may be a metal oxide and the insulating layer may be an insulating film with a high dielectric strength. Examples of the conductive material or layer (e.g., the nanoclusters) may include, but are not limited to, molybdenum (Mo), tungsten (W), titanium (Ti), hafnium (Hf), tantalum (Ta), niobium (Nb), platinum (Pt), palladium (Pd), ruthenium (Ru), and iridium (Ir), and each of their oxides, carbides, and/or nitrides. References to molybdenum suboxide ($MoO_{3-x}$) are discussed below, but one skilled in the art would appreciate that any other conductive material, such as the metals, oxides, carbides, and nitrides mentioned above, may also be used in the portions of the discussion below.

In some embodiments, the insulating layers or material may be an insulator with a high dielectric strength. For example, the insulator may have a dielectric strength greater than or equal to 25 MV/m. Examples of such insulating layers or material include, but are not limited to, aluminum oxide ($Al_2O_3$) and silicon oxide ($SiO_2$).

As such, in some embodiments, the charge drain coating 410 may be made of layers of molybdenum suboxide ($MoO_{3-x}$) nanoclusters embedded within layers of aluminum oxide ($Al_2O_3$). The charge drain coating 410 may be a thin film with a resistivity in the mesoscale (i.e., a resistivity between a semiconducting material and an insulating material). In some embodiments, such a mesoscale resistivity may be defined between $10^4$ to $10^9$ ohm-meters. Due to the mesoscale resistivity, the charge drain coating 410 will not heat up and damage an associated electron-optical MEMS component (e.g., the lenslet) and will not short an electrode that is associated with the electron-optical MEMS component, as opposed to a conducting or semiconducting coating. Furthermore, in some embodiments, such a charge drain coating including molybdenum suboxide nanoclusters embedded within layers of aluminum oxide may exhibit greater long term stability as opposed to conducting or semiconducting coatings. For example, the charge drain coating may be subjected to an electrical field up to 250 MV/m.

Returning to FIG. 5, the charge drain coating 410 may include insulating layers 510, 520, 540, and 550 and at least one doping layer 530. In some embodiments, the doping layer 530 may include one or more nanoclusters 560. For example, the molybdenum used in the doping layer 530 may coalesce or form into nanoclusters 560. In some embodiments, the molybdenum-based nanoclusters may be between 1 to 3 nanometers in size. Such coalescing of the molybdenum into the nanoclusters may be due to metal material having a higher surface energy than an oxide material and thus tends to form islands (i.e., nanoclusters) on oxide surfaces. Furthermore, in some embodiments, the thickness of the charge drain coating 410 may range between 20 nm and 100 nm. However, any thickness may also be used for the charge drain coating 410. Although the charge drain coating 410 of FIG. 5 shows four insulating layers (e.g., 510, 520, 540, and 550) and one doping layer (e.g., 530), any number of insulating layers and doping layers may be used.

As previously disclosed, the charge drain coating 410 may include layers of conductive nanoclusters embedded within insulating layers of high dielectric strength. Since the nanoclusters (e.g., the molybdenum oxide) are conductive and the aluminum oxide insulating layers are high band gap insulators with deeper oxygen vacancy states (e.g., 2 electron-volts below the conduction band), the conductivity of the charge drain coating 410 is due to the conductive nanoclusters donating free electrons to the conduction band of the insulating layers. In some embodiments, the conductive mechanism for the charge drain coating 410 may be a Frenkel-Poole (FP) emission The FP emission mechanism may enable the insulating material (e.g., the insulating layers of the charge drain coating 410) to conduct electricity and drain electrons as previously disclosed. The FP emission mechanism may enable the draining of the electrons through the insulating layers by the following method. The electrons may be generally trapped in localized states and random thermal fluctuations may give the electron enough energy to be removed from the localized state and move to a conduction band (and subsequently drained). Under the FP emission mechanism, in a larger electric field, the electron may not require as much thermal energy to get into the conduction band.

As such, the conductive or electrical transport mechanism of the charge drain coating 410 may be based on the molybdenum-based nanoclusters. The oxygen vacancies in the molybdenum oxide-based nanoclusters may serve as dopants to the aluminum oxide insulating layers. Furthermore, the insulating layers may protect the nanoclusters in the doping layers from oxidation and reduction, maintaining the carrier density in the overall film. In some embodiments, the insulating layers may protect the nanoclusters in the doping layer from electrical breakdown (e.g., the oxidation or reduction) because the vacancy states of the insulating layer are deeper into the band gap and do not contribute donor carriers.

In some embodiments, the charge drain coating 410 may be tuned for resistivity (e.g., between $10^4$ to $10^9$ ohm-meters). The resistivity of the charge drain coating 410 may be based on the doping layers and insulating layers. For example, the resistivity of the charge drain coating 410 may be based on the ratio between the number of doping layers to the number of insulating layers. Thus, the electrical and physical characteristics of the charge drain coating 410 may be changed based on the number or proportions of doping and insulating layers. The proportions of the doping layers and the insulating layers may be controlled by alternating or varying the layers between the doping layers and insulating layers when the charge drain coating 410 is deposited (e.g., upon the lenslets of the electron-optical MEMS component).

As such, the charge drain coating 410 may be a high dielectric strength and high resistivity material (e.g., an insulator) that encapsulates another material with a low resistivity (e.g., doping nanoclusters). The lower resistivity encapsulated material may donate carriers to the encapsulating material, thereby lowering the resistivity of the encapsulating material. Additional details with regard to the charge drain coating in general are disclosed in U.S. patent application Ser. No. 13/011,645 entitled "Microchannel plate detector and methods for their fabrication" filed on Jan. 21, 2011, U.S. patent application Ser. No. 13/525,067 entitled "Tunable Resistance Coatings" and filed on Jun. 15, 2012, and U.S. patent application Ser. No. 13/804,660 entitled "Tunable Resistance Coatings" and filed on Mar. 14, 2013, all of which are hereby incorporated by reference.

FIG. 6 illustrates a flow diagram of a method 600 to create the charge drain coating. In general, the method 600 may deposit a charge drain coating (e.g., charge drain coating 410) on the sidewalls (e.g., sidewalls 210 and 220) of a lenslet (e.g., lenslet 110, 120, and/or 130) of an electron-optical MEMS component (e.g., electron-optical MEMS component 100).

In some embodiments, the charge drain coating may be deposited by an atomic layer deposition (ALD) process. The atomic layer deposition process may be based on the sequential use of a gas phase chemical process. For example, the atomic layer deposition process to deposit the charge drain coating may use at least two chemicals. Such chemicals may be referred to as precursors. The precursors may react with a surface separately and one at a time in a sequential and self-limiting process (e.g., the amount of material deposited in each cycle or sequence is constant regardless of precursor exposure so long as the precursor exposure is sufficient to saturate the reactive surface sites). The insulating layers and the doping layers of the charge drain coating may use different combinations of at least two chemicals. By exposing the precursors to the surface repeatedly, the insulating layers and the doping layers of the charge drain coating may be deposited.

As shown in FIG. 6, the method 600 may, at step 610, clean a substrate surface. For example, the surface of an electron-optical MEMS component (e.g., electron-optical MEMS component 100) may be cleaned. In some embodiments, such cleaning may also clean the sidewalls (e.g., sidewalls 210 and 220) of a lenslet (e.g., lenslet 110). The cleaning of the substrate surface may be performed ultrasonically in acetone for a period of time (e.g., five minutes), following by flushing with ultrahigh purity nitrogen at 20 psi for another period of time (e.g., 30 seconds). An alternative method of cleaning is by exposing the surface of the electron-optical MEMS component 100 to ozone for a few minutes to a few hours. Next, at step 620, a desired resistivity for the coating to be deposited on the sidewalls of the lenslets may be determined. For example, a resistivity for the charge drain coating may be determined. Next, at step 630, the insulating layer may be deposited based on the desired resistivity. In some embodiments, the insulating layer may be an aluminum oxide ($Al_2O_3$) material. Such an aluminum oxide layer may be deposited in the atomic layer deposition process with alternating exposures to two precursors. For example, a first precursor of trimethylaluminum (TMA) and a second precursor of $H_2O$ may be used. In such an atomic layer deposition process, the first precursor of trimethylaluminum may be introduced in a process chamber and then the process chamber may be purged or evacuated to remove any of the first precursor that has not reacted as well as any gaseous byproducts. Next, the second precursor of $H_2O$ may be introduced in the process chamber to engage in a reaction with the first precursor. Subsequently, the process chamber may be purged or evacuated to remove any of the second precursor that has not reacted as well as any gaseous byproducts remaining in the process chamber.

Furthermore, at step 640, the doping layer (e.g. the nanocluster layer) may be deposited based on the desired resistivity. In some embodiments, the doping layer may be a molybdenum suboxide ($MoO_{3-x}$) material, where $0<x\le1$. Such a molybdenum suboxide layer may also be deposited by the atomic layer deposition process with alternating exposures to two further precursors. For example, a third precursor of $Si_2H_6$ and a fourth precursor of $MoF_6$ may be used. In such an atomic layer deposition process, the first precursor of $Si_2H_6$ may be introduced in a process chamber and then the process chamber may be purged or evacuated to remove any of the third precursor that has not reacted as well as any gaseous byproducts. Next, the fourth precursor of $MoF_6$ may be introduced into the process chamber to engage in a reaction with the third precursor. Subsequently, the process chamber may be purged or evacuated to remove any of the fourth precursor that has not reacted as well as any gaseous byproducts remaining in the process chamber. In some embodiments, the $Si_2H_6$ may serve to reduce the absorbed $MoF_6$ to metallic molybdenum (Mo). Furthermore, the molybdenum may coalesce into nanoclusters as previously disclosed and may become partially oxidized to form the molybdenum suboxide nanoclusters.

At step 650, the method 600 may alternate between the depositing of the insulating layers (e.g., as described with relation to step 630) and the doping layers (e.g., as described with relation to step 640). In some embodiments, the alternating of the layers may be based on the desired thickness of the charge drain coating as well as the desired resistivity of the charge drain coating. For example, the resistivity may be tuned or configured based on the layers that are deposited in the atomic layer deposition process. As such, the resistivity of the charge drain coating may be based on the composition (e.g., the ratio of the insulating and doping layers) of the charge drain coating itself. Since each of the layers is controlled in the atomic layer deposition process, the resistivity of the charge drain coating may be controlled by adjusting the precursor ratio of the insulating components and the doping components in the charge drain coating. In some embodiments, the precursor ratio may be defined as % $C=C/(I+C)\times100\%$, where C is the number of doping layer (e.g., Mo) atomic layer deposition cycles that have been performed while depositing the charge drain coating and I is the number of insulating layer (e.g., $Al_2O_3$) atomic layer deposition cycles performed while depositing the charge drain coating. Finally, at step 660, the method 600 may remove the charge drain coating from bond pads of an electron-optical MEMS component. For example, the bond pads of the electron-optical MEMS component may be exposed while the lenslets with the deposited charge drain coating may be covered and the charge drain coating that has been deposited on the bond pads may be removed (e.g., etched). Furthermore, in some embodiments, a thermal annealing process may also be performed after the depositing of the charge drain coating to the sidewalls of the lenslets.

As such, an atomic layer deposition process may be used to uniformly apply a charge drain coating to an electron-optical MEMS component. The charge drain coating may be applied in the atomic layer deposition process by alternating exposures of a first group of precursors to form an insulating layer and then alternating exposures of a second group of precursors to form a doping layer. In some embodiments, the atomic layer deposition process may deposit the insulating layers and doping layers in order to achieve a desired resistivity. For example, in some embodiments, the atomic layer deposition process may be used to achieve a precursor ratio of 10% doping layers. In such a circumstance, the atomic layer deposition process may be used to deposit or form nine insulating layers (e.g., $Al_2O_3$) and then a single doping layer (e.g., $MoO_{3-x}$). The atomic layer deposition may again be used to deposit another nine insulating layers and then another doping layer. Such process may be repeated until a desired thickness of the charge drain coating has been achieved. However, in some embodiments, the top and bottom layers of the charge drain coating must be an insulating layer. Thus, a charge drain coating may be created such that it first includes nine insulating layers, then one doping layer, then another nine insulating layers, another doping layer, and at least one additional insulating layer. Although specific numbers of insulating and doping layers are described, any number of insulating layers and doping layers may be used. For example, the number of insulating layers and doping layers may vary based on the desired resistivity and the desired thickness of the charge drain coating.

In some embodiments, the resistivity of the charge drain coating may be decreased as the precursor ratio increases. In other words, as more of the doping layers are used in the charge drain coating, the conductivity of the charge drain coating material itself also increases. In some embodiments, the resistivity may drop exponentially with respect to the precursor ratio.

In some embodiments, the insulating and doping layers are deposited in the same process chamber while under similar process conditions. For example, the deposition temperature for the deposition of the insulating layers and doping layers may be identical, thereby simplifying the task of separately depositing the insluting layers and the doping layers to form the charge drain coating. Furthermore, the ALD process may be a technique for growing complex layers in a precisely controlled manner with several unique advantages. Such advantages may be that the ALD process is based on a binary sequence of self-limiting chemical reactions between precursor vapors and a solid surface. Since the two reactions in the binary sequence may be separately performed, the gas phase precursors may not be mixed and thus this may eliminate any possibility of gas phase reactions that can form particulate contaminants that cause non-self-limiting chemical vapor deposition. The self-limiting aspect of the ALD process may lead to continuous pinhole-free films for the charge drain coating, improved step coverage, and uniform deposition on high aspect ratio structures (i.e., uniform deposition on the sidewalls of the lenslets). The ALD process may also be extended to large area substrates and batch processing of multiple substrates.

Furthermore, since the thickness of the deposited layers depends on the number of reaction cycles, the thickness of each of the insulating layers and doping layers may be precisely controlled.

As previously disclosed, aluminum oxide may be chosen as the matrix material (e.g., insulating layers) because it has a very high dielectric strength of 1 GV/m in the bulk and up to 3 GV/m in thin films as the thickness approaches 1 nm. Aluminum oxide atomic layer deposition (as discussed in further detail below) with trimethyl aluminum (TMA) and $H_2O$ is a well understood process that may be accomplished over a broad temperature range, uses volatile precursors, and exhibits excellent self-limiting behavior. Similarly, molybdenum atomic layer deposition (ALD) involving $Si_2H_6$ and $MoF_6$ is a favorable process that may also be accomplished over a wide range of temperatures, utilizes high vapor pressure precursors, and provides a high growth per cycle. By blending the $Al_2O_3$ and Mo ALD processes on the sub-nanometer scale, the resistivity of the resulting material (e.g., charge drain coating) may be adjusted over a broad range of values. Both processes may be amenable to future scale-up and commercialization.

As previously disclosed, prior to deposition, the substrates may be cleaned ultrasonically in acetone for five minutes followed by flushing with ultrahigh purity (99.999%) nitrogen at 20 psi for 30 seconds. The $Al_2O_3$ ALD may be performed with alternating exposures to TMA and $H_2O$. The Mo ALD may be performed using alternating exposures to $Si_2H_6$ and $MoF_6$, where $Si_2H_6$ may serve to reduce the adsorbed $MoF_6$ to metallic Mo. All precursors were maintained at room temperature. The TMA and $H_2O$ may be held in steel reservoirs while the $Si_2H_6$ and $MoF_6$ may be held in compressed gas lecture bottles with pressure regulators. The films may be deposited at a temperature of 200 degrees Celsius. The mesoscale resistivity films may be prepared by alternating between the $Al_2O_3$ and the Mo ALD processes. The composition, and hence resistivity, of the film may be controlled by adjusting the precursor ratio of insulating and doping components in the film, as previously disclosed. In some embodiments, the thicknesses of the films may be between 20 and 100 nm. To facilitate sheet resistance measurements, the ALD films may be deposited on coupons with gold "comb structures" which are inter-digitated electrodes that provide a large number of squares for measuring the sheet resistance of highly insulating films. The neighboring combs may have a 2 micrometer gap so that the comb structure has the equivalence of 1/100,000 square. The long-term dielectric strength measurements may be made with an apparatus including a picoammeter and a programmable power supply interfaced to a PC. The coupons may be wire bonded and the tests may be carried out in a vacuum of $10^{-3}$ torr to simulate an example operating environment of an example electron-optical MEMS and in air to observe the effects of oxygen and water. The typical bias applied across the combs may be 50 V, which corresponds to an electric field of 25 MV/m. The temperature-dependent current-voltage (IV) measurements may be made on a probe station in air with a temperature-controlled heater. The thermocouple sensor may be located approximately 5 mm from the measurement location. All electrical measurements may be performed in plane and with two-points because the films' high resistance (e.g., 100 mega-ohms) may dominate over the contact and line resistance.

Figure 6A:
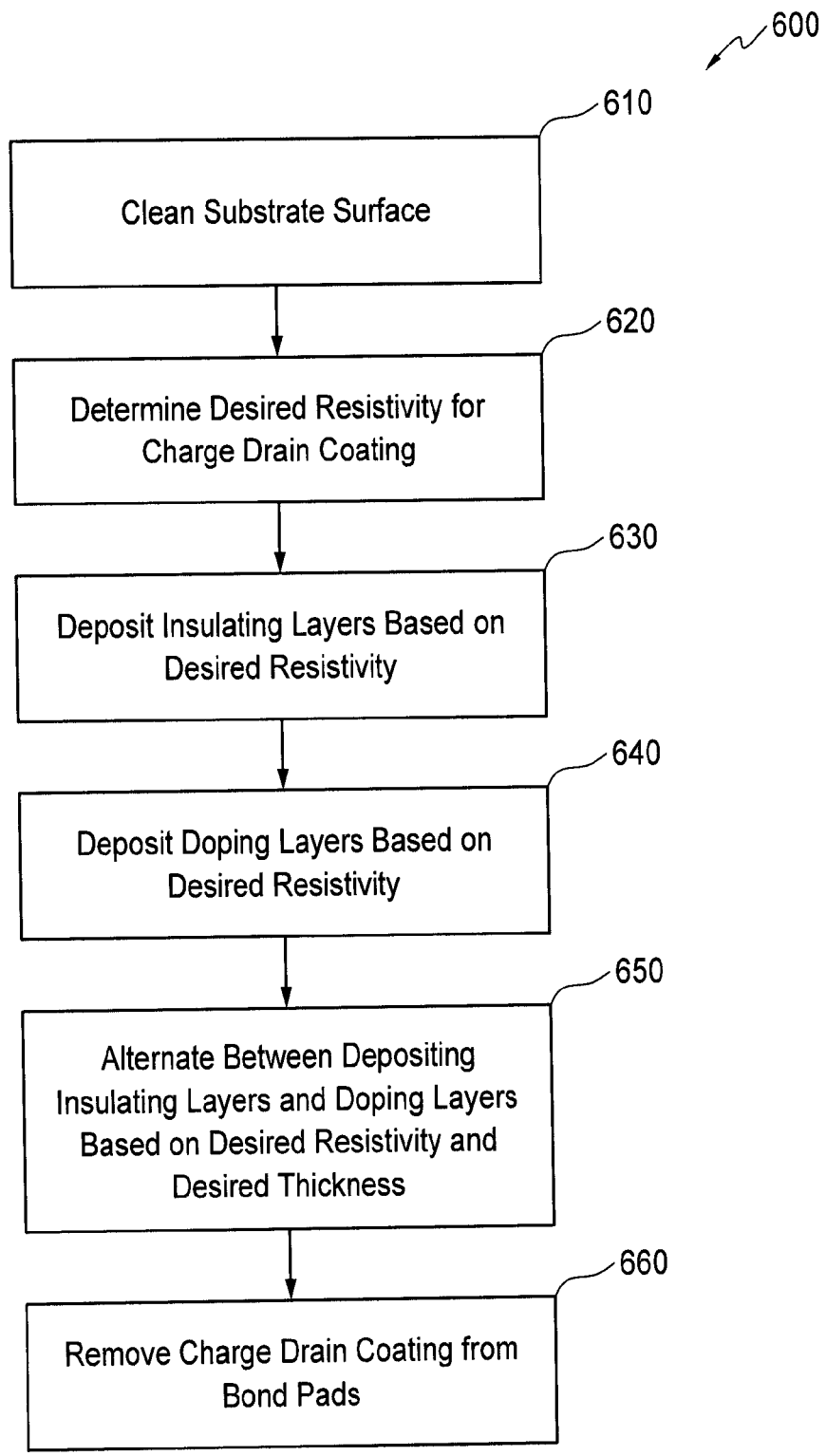
FIG. 6A illustrates a flow diagram of an example method to create or deposit the charge drain coating in accordance with some embodiments of the disclosure.
Figure 6B:
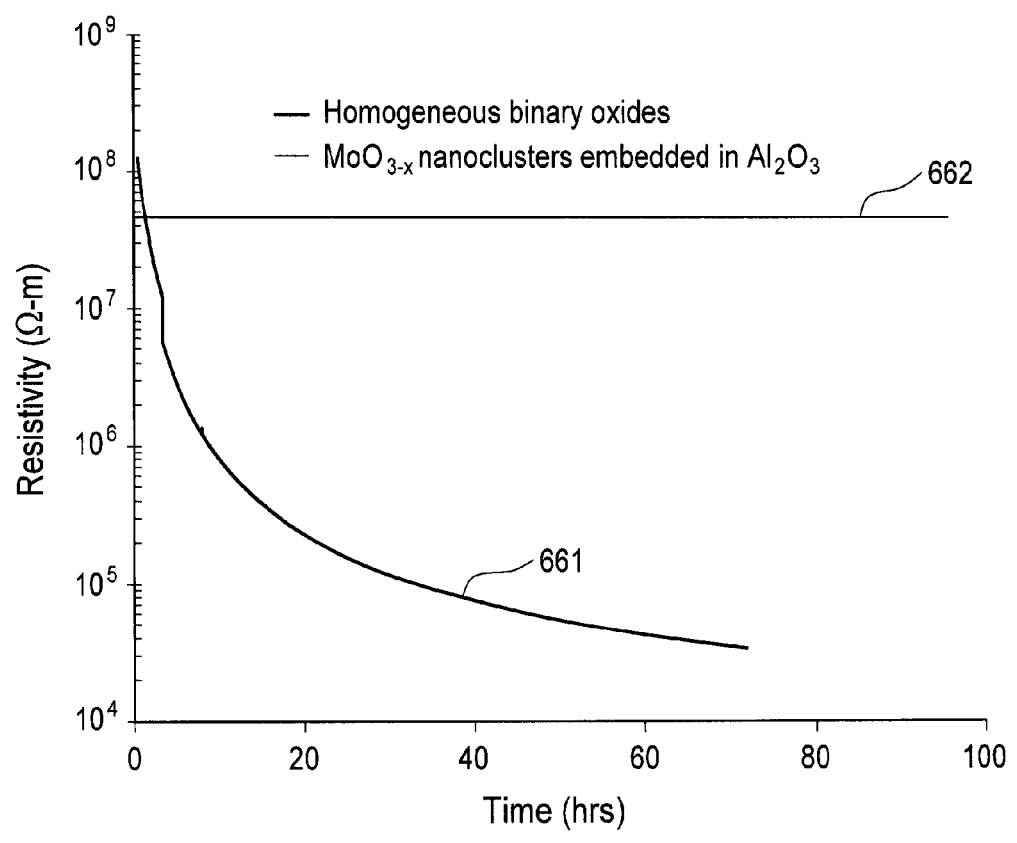
FIG. 6B illustrates the resistivity over time for an example charge drain coating in comparison with the resistivity of a homogeneous film of two oxides in accordance with some embodiments.
Figure 6C:
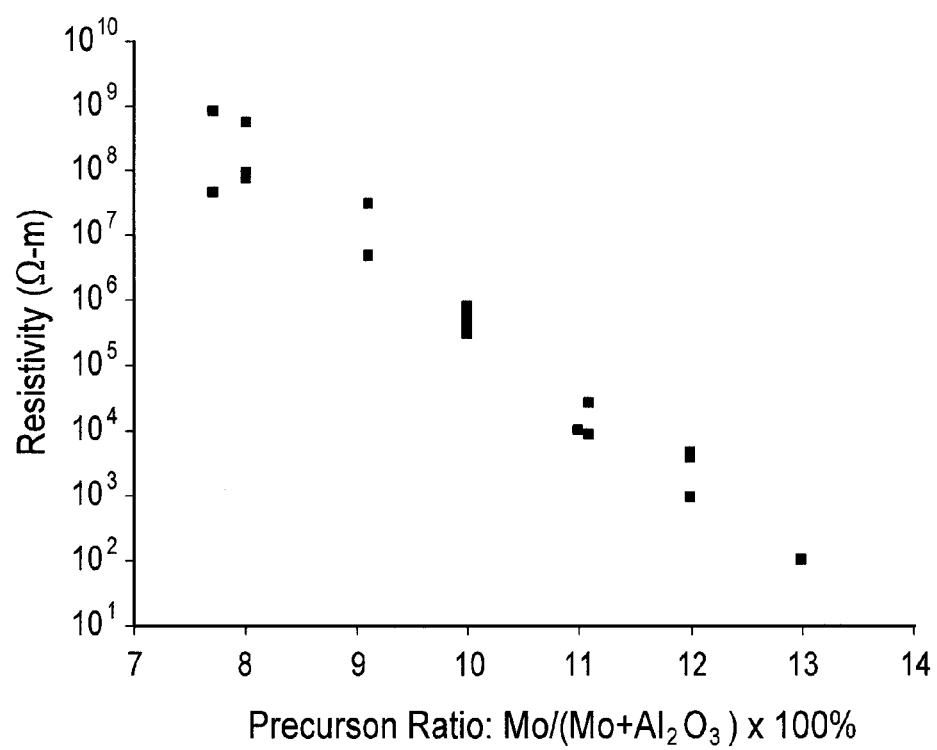
FIG. 6C illustrates the resistivity as a function of the precursor ratio for an example charge drain coating in accordance with some embodiments.

FIG. 6B illustrates the sheet resistance of a 40 nm film 662 (i.e., charge drain coating) prepared with a precursor ratio of 8% Mo held at 25 MV/m in comparison with that of a homogeneous film of two oxides 661. While the resistivity of the homogeneous film 661 dropped by over 3 orders of magnitude in less than 40 hours, the $MoO_{3-x}/Al_2O_3$ charge drain coating film 662 resistivity remained nearly constant (e.g., less than a 3% drop) over 87 hours of testing. At this rate, the time required for the resistance of our film to drop by half is estimated to be three months, which exceeds the need for a typical REBL use or application. FIG. 6C illustrates the resistivity of the $MoO_{3-x}/Al_2O_3$ charge drain coating film as a function of percentage of Mo (e.g., Mo-based layers) on a semi logarithmic scale. As shown, data forms a straight line, indicating that the resistivity drops exponentially with relation to the Mo percentage in the charge drain coating. This is an indication that the $MoO_{3-x}$ layers do not form continuous sheets (and instead forms the nanoclusters as previously described), as this would have resulted in a first order reciprocal relationship between Mo percentage and resistivity.

Figure 6D:
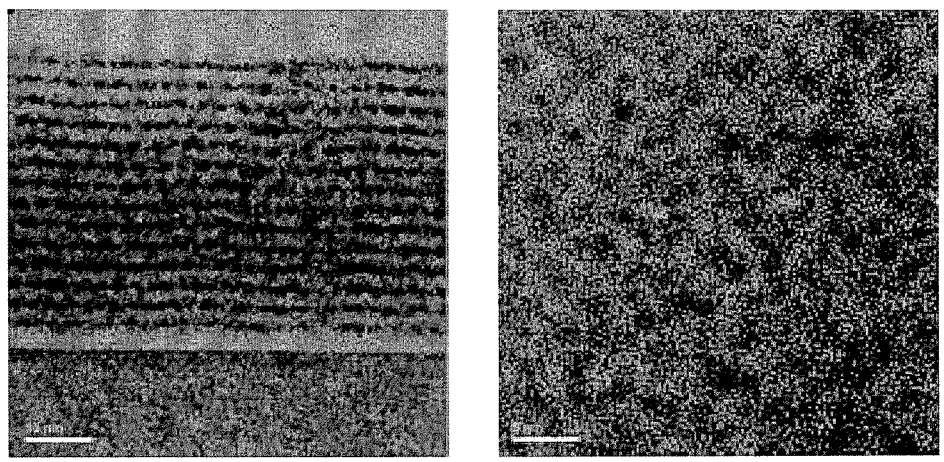
FIG. 6D illustrates a cross sectional view and plan view of an example charge drain coating with nanoclusters in accordance with some embodiments.

FIG. 6D illustrates a key difference between the $MoO_{3-x}/Al_2O_3$ charge drain coating film and the homogeneous film of two oxides. The latter is amorphous and single phase, so the film may be featureless. In contrast, the $MoO_{3-x}/Al_2O_3$ charge drain coating film may be segregated into phases with $MoO_{3-x}$ appearing darker than $Al_2O_3$ because of molybdenum's higher electron scattering cross section. Instead of forming a continuous film, the Mo has coalesced into the previously discussed nanoclusters of about one to three nanometers (nm). In some embodiments, such coalescing may be due to metals tending to have higher surface energies than oxides and tending to form islands (e.g., nanoclusters) on oxide surfaces. Separately, all Mo species are in a mix of +4 and +6 oxidation states and none in the metallic state. However, in some embodiments, some of the Mo species may exist in the metallic state. In some embodiments, the metal islands may first be formed and subsequently oxidized to $MoO_{3-x}$, for example by the $H_2O$ exposures. $MoO_{3-x}$ is a conductive oxide due to oxygen vacancy defects. Aluminum oxide, on the other hand, is a high-band gap insulator with deep oxygen vacancy defect states two electron-volts (eV) below the conduction band; these defect states are too deep to provide free carriers the aluminum oxide at room temperature. Consequently, the $MoO_{3-x}$ nanoclusters may be responsible for providing free carriers to the composite films. Moreover, $Al_2O_3$ has one of the highest dielectric strengths among all naturally occurring materials (34 MV/m) and may be responsible for the high dielectric strength of the composite films.

Figure 6E:
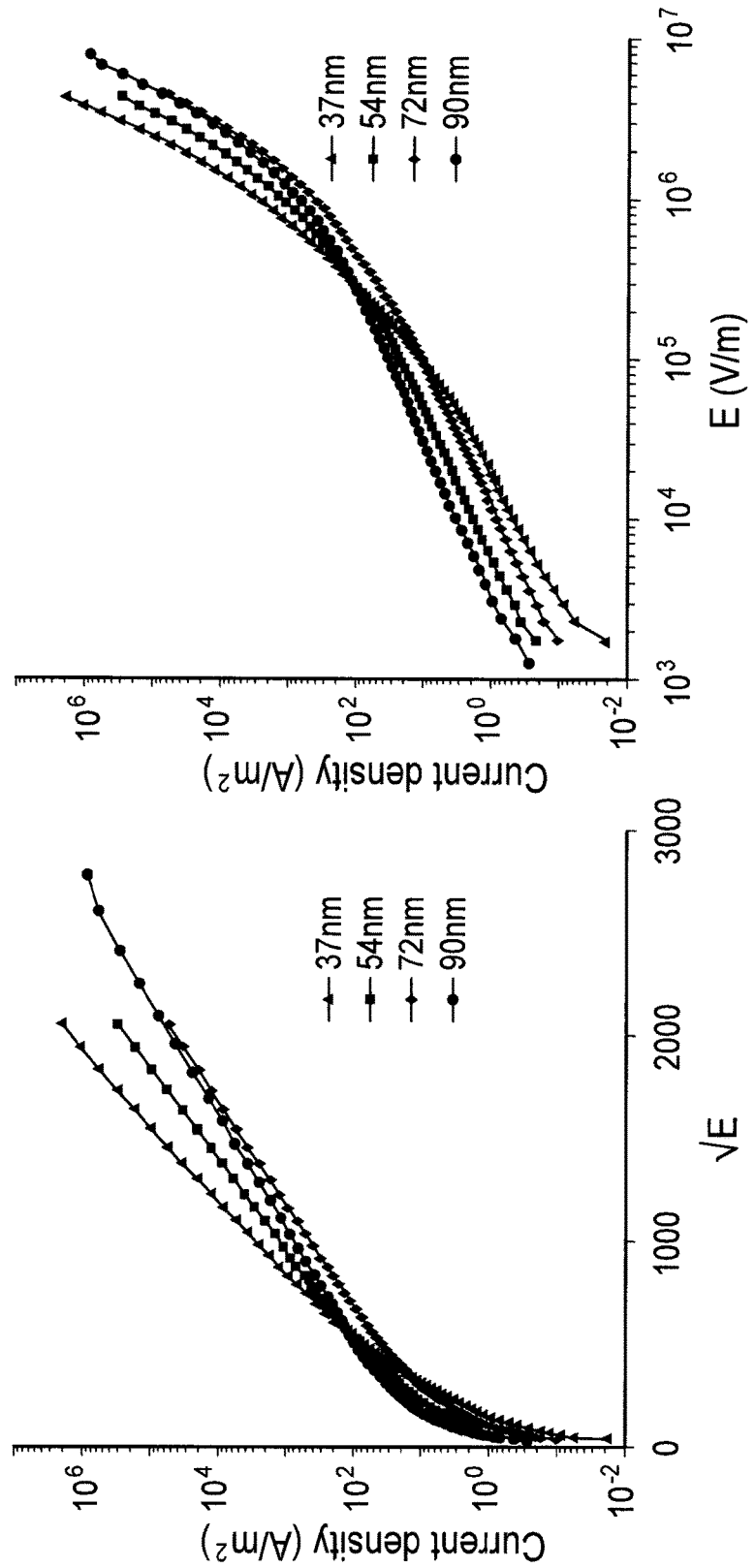
FIG. 6E illustrates current-voltage (IV) curves associated with an example charge drain coating in accordance with some embodiments of the disclosure.
Figure 8A:
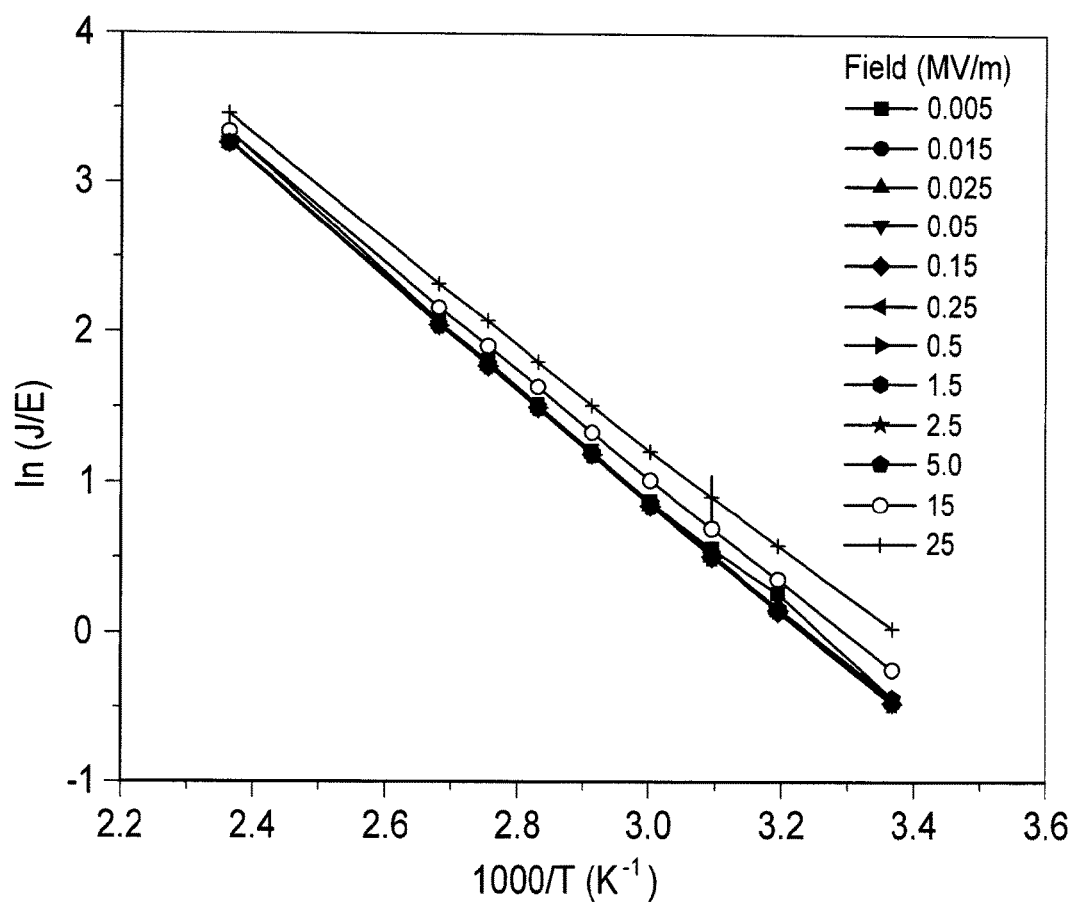
FIG. 8A illustrates an Arrhenius plot of IV data at different applied electric fields in accordance with some embodiments.
Figure 8B:
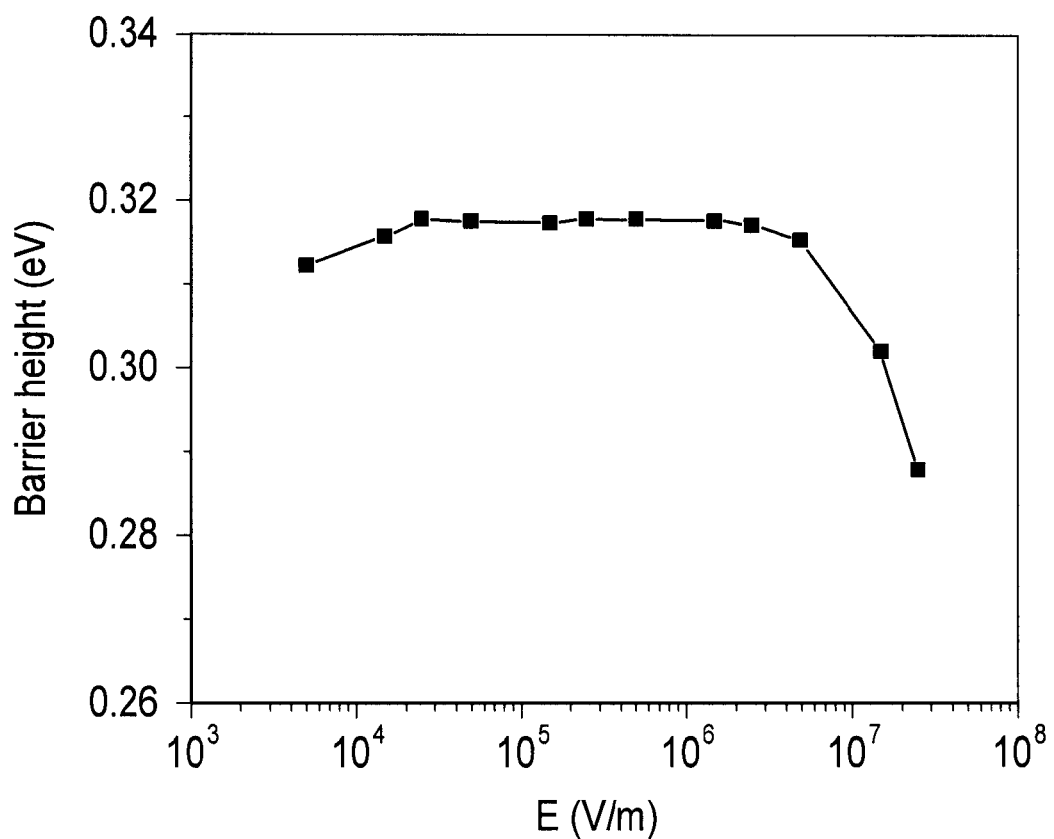
FIG. 8B illustrates the slope of the curves in the Arrhenius plot and demonstrates an activation energy of approximately 0.31 eV in accordance with some embodiments.

Further electrical tests illustrate the previously disclosed mechanism behind the electrical properties of the charge drain coating films. FIG. 6E shows IV curves for a series of $MoO_{3-x}/Al_2O_3$ charge drain coating films with thicknesses ranging from 37 nm to 90 nm and prepared with 8% Mo (e.g., precursor ratio). These IV curves are plotted as J/E vs. √E on a semi-log scale and J vs. E on a log-log scale. The data plotted on the semi log scale form straight lines at higher electric fields and the data on the log-log scale show no second order dependence on E. Such data indicates that FP emission, not Space-Charge Limited (SCL) emission, is the dominant conduction mechanism in the $MoO_{3-x}/Al_2O_3$ charge drain coating films. The difference in slope values at high E may be due to surface and interfacial effects which dominate the thinner films. Using equations for the FP effect, the calculated effective dopant barrier height by plotting the ln(J/E) vs. 1/T for different E, as shown in FIG. 8A. The slope of the curve as plotted in the right IV curve as shown in FIG. 8B is the effective barrier height, which at a low field electric field is approximately 0.32 eV, and at a high electric field is lowered to below 0.29 eV. Such data corresponds to the ionization energy of oxygen vacancies in $MoO_{3-x}$ of 0.27 eV. However, the ionization energy varies as a function of x. For example, pure $MoO_2$ is semi-metallic as its valence band is only partly filled. The conductivity of the $MoO_{3-x}/Al_2O_3$ charge drain coating films may thus be customized because the precursor ratio is precisely and reproducibly controlled in the ALD process and the conductivity remains stable because the $Al_2O_3$ matrix or layers are sufficiently robust to protect the MoO-based nanoclusters from oxidation and/or reduction under a strong or high electric field.

Figure 6F:
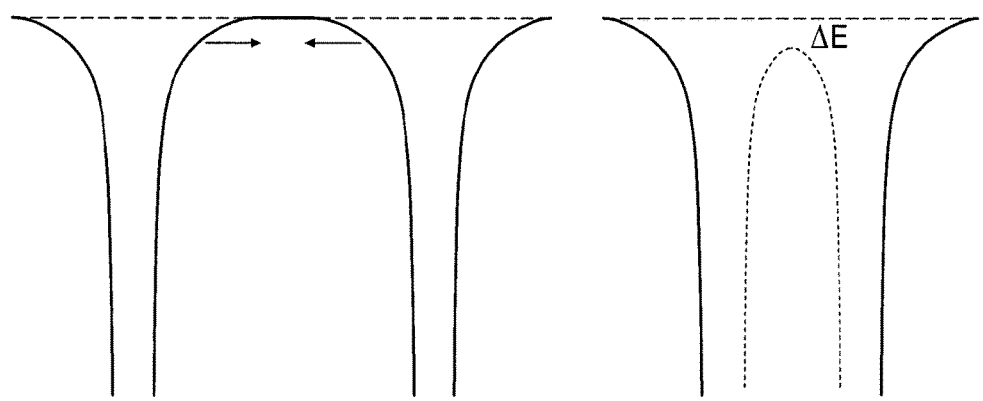
FIG. 6F illustrates IV curves associated with an example charge drain coating at different applied electric fields in accordance with some embodiments.

Thus, the overall picture of the electrical transport mechanism for the Mo nanoclusters embedded in an amorphous $Al_2O_3$ matrix of layers has emerged as follows. The fundamental electrical transport mechanism is FP emission with the oxygen vacancies in the $MoO_{3-x}$ nanoclusters serving as dopants to the $Al_2O_3$ matrix of layers. At lower electric fields, the ionization energy of these carriers to the $Al_2O_3$ conduction band may be 0.32 eV. The $Al_2O_3$ matrix of layers also serves to protect the $MoO_{3-x}$ from further oxidation and reduction, maintaining the carrier density in the charge drain coating under a strong or high electric field. In charge drain coating films which have a higher $MoO_{3-x}$ content (e.g., higher precursor ratio), the neighboring layers of nanoclusters may be closer together. The shorter inter-cluster distance may cause the potential between neighboring defect sites to merge and effectively lower the barrier between neighboring nanoclusters as illustrated in FIG. 6F.

Figure 6G:
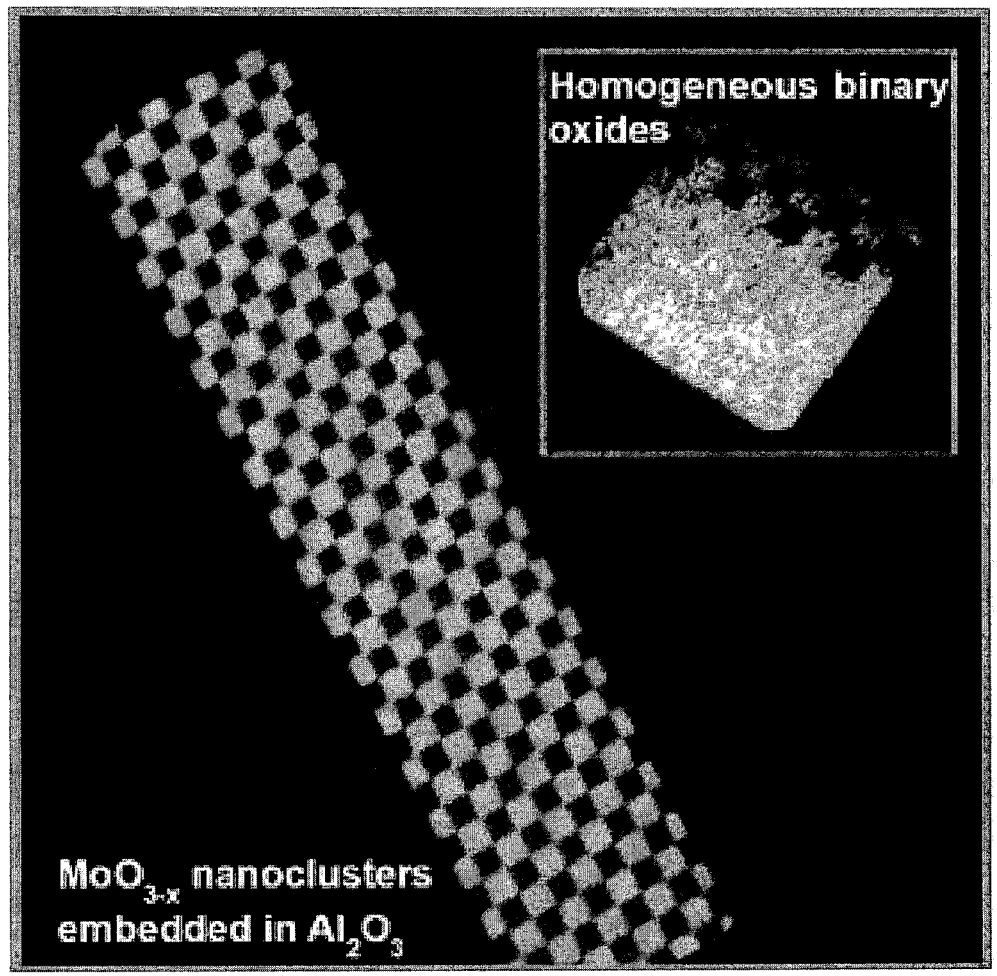
FIG. 6G illustrates an image from an electron-optical MEMS device coated with a homogeneous film of two oxides in comparison with an image from the electron-optical MEMS device coated with an example charge drain coating in accordance with some embodiments.
Figure 7A:
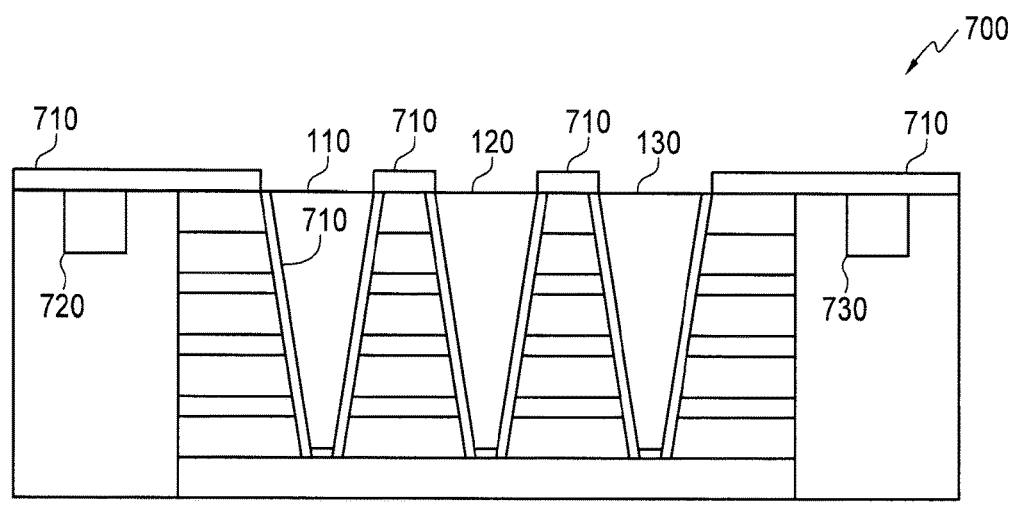
FIG. 7A illustrates an example electron-optical MEMS device after the atomic layer deposition process has deposited a charge drain coating in accordance with some embodiments.

The $MoO_{3-x}/Al_2O_3$ charge drain coating films prove effective in draining charge from an electron-optical MEMS device. For example, a 14 nm layer of the $MoO_{3-x}/Al_2O_3$ charge drain coating film with 10% Mo precursor ratio may be applied to the electron-optical MEMS device and such application has resulted in a significant performance improvement. FIG. 6G illustrates the images from the electron-optical MEMS device coated with a homogeneous film of two oxides and alternatively the electron-optical MEMS device coated with the $MoO_{3-x}/Al_2O_3$ charge drain coating film. With the $MoO_{3-x}/Al_2O_3$ charge drain coating films, the efficiency of the electron-optical MEMS device increased from 40% to 60% and the contrast improved from 10:1 to 50:1 when compared to the electron-optical MEMS device coated with the homogeneous film of two oxides. Furthermore, the lifetime of the electron-optical MEMS device improved by orders of magnitude (e.g., from a few days to three months FIG. 7A illustrates an example electron-optical MEMS device 700 after the atomic layer deposition process has deposited a charge drain coating. In general, the electron-optical MEMS device 700 may be a digital pattern generator including lenslets that are integrated with a complementary metal-oxide-semiconductor (CMOS) circuit. The electron-optical MEMS device 700 may be in a process chamber where the atomic layer deposition process may deposit uniform layers upon all surface areas of the electron-optical MEMS device 700.

As shown in FIG. 7A, the electron-optical MEMS device 700 may be a DPG with lenslets 110, 120, and 130. In some embodiments, the DPG may include a 248×4096 array of lenslets. Furthermore, the lenslets may be cylindrical holes or wells through the electrode and insulating layers of the electron-optical MEMS device (e.g., the layers 130, 131, 132, 133, 140, 141, 142, 143, and 144). The electron-optical MEMS device 700 may also include bond pads 720 and 730. In some embodiments, the bond pads may be coupled or connected to electrodes for each of the lenslets and/or the CMOS circuitry. As such, the electron-optical MEMS device 700 may include a CMOS bond pad (e.g., bond pad 720) and an electrode bond pad (e.g., bond pad 730). In some embodiments, the electron-optical MEMS device 700 may be subject to an atomic layer deposition process as earlier disclosed. For example, the atomic layer deposition process may uniformly deposit multiple layers of materials to form a charge drain coating 710. As shown, the charge drain coating 710 may cover the sidewalls and bottoms of the lenslets (e.g., lenslets 110, 120, and 130), as well as other surfaces of the electron-optical MEMS device 700, such as the bond pads 720 and 730.

Figure 7B:
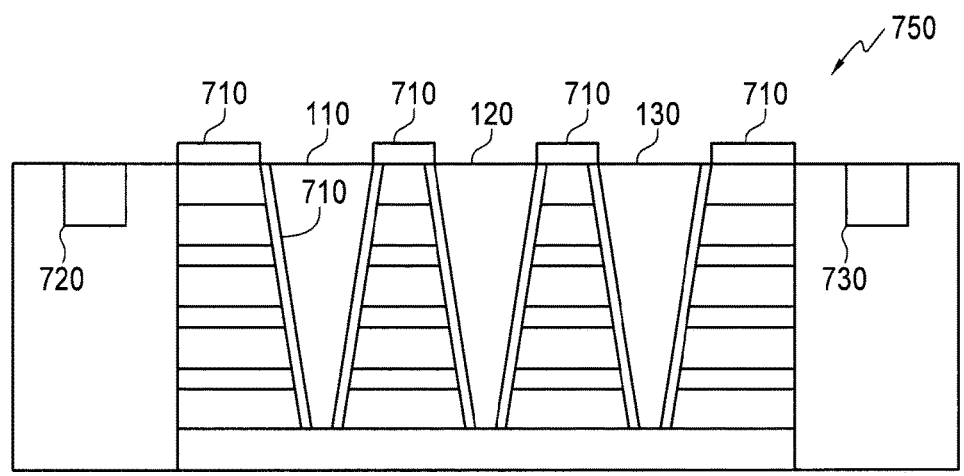
FIG. 7B illustrates an electron-optical MEMS device after portions of the charge drain coating have been removed in accordance with some embodiments of the disclosure.

FIG. 7B illustrates an electron-optical MEMS device 750 after portions of the deposited charge drain coating have been removed. In general, the electron-optical MEMS device 750 may be subject to an etching or other process to remove the charge drain coating from bond pads or other components of the electron-optical MEMS device. The electron-optical MEMS device may be in a process chamber where the portions of the charge drain coating deposited upon the electron-optical MEMS device may be removed.

As shown in FIG. 7B, portions of the charge drain coating 710 may be removed from the surfaces of the bond pads 720 and 730. In the same or alternative embodiments, the charge drain coating 710 may also be removed from the bottom of the lenslets. However, the charge drain coating 710 covering the sidewalls of the lenslets may remain intact. In some embodiments, the portions of the charge drain coating 710 over the bond pads 720 and 730 and other such components may be removed by etching such as an ion etching process or an argon etching process. As such, portions of the charge drain coating 710 may be removed and other portions of the charge drain coating 710 may remain intact.

In some embodiments, the charge drain coating as disclosed herein may further be used in other REBL applications. For example, ceramic components of an electron gun may be covered by the charge drain coating. Sharp points in the electron gun or column ceramics may lead to arcing. However, covering such sharp points in the ceramic material with the charge drain coating may be smoothed, thus reducing the arcing and provide better use in the REBL tool.

In the description above and throughout, numerous specific details are set forth in order to provide a thorough understanding of an embodiment of this disclosure. It will be evident, however, to one of ordinary skill in the art, that an embodiment may be practiced without these specific details. In other instances, well-known structures and devices are shown in block diagram form to facilitate explanation. The description of the preferred embodiments is not intended to limit the scope of the claims appended hereto. Further, in the method disclosed herein, various steps are disclosed illustrating some of the functions of an embodiment. These steps are merely examples, and are not meant to be limiting in any way. Other steps and functions may be contemplated without departing from this disclosure or the scope of an embodiment.

What is claimed is:

1. A micro-electromechanical systems (MEMS) device to receive an electron beam in an electron-beam lithography chamber, the MEMS device comprising:
a plurality of lenslets to receive electrons from the electron beam, each of the lenslets are configured to either transmit or not to transmit, or to reflect or not to reflect, at least some of the electrons from the electron beam; and
a charge drain coating on at least some of the inner surfaces of each of the lenslets to drain any of the electrons that have become embedded into the charge drain coating, the charge drain coating includes insulating material and at least one doping material embedded within the insulating material, the doping material includes at least one nanocluster.

2. The MEMS device of claim 1, wherein the inner surfaces includes the sidewalls of the lenslets.

3. The MEMS device of claim 1, wherein the MEMS device is used for reflective electron beam lithography (REBL).

4. The MEMS device of claim 1, wherein the MEMS device is a digital pattern generator (DPG) with an array of the lenslets.

5. The MEMS device of claim 4, wherein each of the lenslets are holes in a substrate of the MEMS device, each of the lenslets are selectively configured to transmit or not to transmit, or to reflect or not to reflect, at least some of the electrons.

6. The MEMS device of claim 1, wherein the charge drain coating includes a plurality of layers of the insulating material and a plurality of layers of the doping material, the doping layers include clusters of the doping material.

7. The MEMS device of claim 1, wherein the insulating material is at least one of aluminum oxide ($Al_2O_3$) and silicon oxide ($SiO_2$) and the doping material is a metal or a metal oxide, carbide, nitride, or elemental form of at least one of molybdenum (Mo), tungsten (W), titanium (Ti), hafnium (Hf), tantalum (Ta), niobium (Nb), platinum (Pt), palladium (Pd), ruthenium (Ru), or iridium (Ir).

8. A system comprising:
an electron beam emitter configured to produce an electron beam; and
a digital pattern generator (DPG) to be illuminated by the electron beam from the electron beam emitter, the DPG comprising:
a plurality of lenslets to receive electrons from the electron beam and to either absorb or reflect at least some of the electrons from the electron beam; and
a coating on the sidewalls of each of the lenslets to drain any of the electrons that come into contact with the coating, the coating includes insulating material and at least one doping material embedded within the insulating material, the doping material includes at least one nanocluster.

9. The system of claim 8, wherein the doping material includes at least one cluster of doping material that is a metal or a metal oxide, carbide, nitride, or elemental form of at least one of molybdenum (Mo), tungsten (W), titanium (Ti), hafnium (Hf), tantalum (Ta), niobium (Nb), platinum (Pt), palladium (Pd), ruthenium (Ru), or iridium (Ir).

10. The system of claim 8, wherein the system is used for reflective electron beam lithography (REBL).

11. The system of claim 8, wherein each of the lenslets are holes in the DPG, each of the lenslets are selectively configured to either absorb or reflect at least some of the electrons.

12. The system of claim 8, wherein the insulating material has a high dielectric strength and the doping material is an oxide, carbide, nitride, or elemental form of a metal.

13. The system of claim 8, wherein the insulating material is composed of aluminum oxide and the doping material is composed of molybdenum suboxide ($MoO_{3-x}$) material, where $0 < x \leq 1$.

14. The system of claim 8, wherein the insulating material has a high dielectric strength.

* * * * *